United States Patent [19]

Yamamoto et al.

[11] Patent Number: 5,394,011
[45] Date of Patent: Feb. 28, 1995

[54] PACKAGE STRUCTURE FOR SEMICONDUCTOR DEVICES AND METHOD OF MANUFACTURING THE SAME

[75] Inventors: Hiroyasu Yamamoto; Takayuki Konuma; Akira Shika; Hiroyoshi Suzuki; Masanori Katouno; Kaori Sato, all of Iwaki, Japan

[73] Assignees: Iwaki Electronics Co. Ltd.; Fuji Electrochemical Co., Ltd., both of Tokyo, Japan

[21] Appl. No.: 972,459

[22] PCT Filed: Jun. 11, 1992

[86] PCT No.: PCT/JP92/00745

§ 371 Date: Jul. 6, 1993

§ 102(e) Date: Jul. 6, 1993

[87] PCT Pub. No.: WO93/00705

PCT Pub. Date: Jan. 7, 1993

[30] Foreign Application Priority Data

Jun. 20, 1991 [JP] Japan ................................. 3-176184
May 8, 1992 [JP] Japan ................................. 4-143558

[51] Int. Cl.6 ..................... H01L 39/02; H01L 23/02; H01L 23/12
[52] U.S. Cl. .................... 257/693; 257/709; 257/710; 257/772; 257/758
[58] Field of Search ............... 257/668, 678, 690, 692, 257/693, 698, 700, 701, 703, 704, 729, 772, 786, 758, 710

[56] References Cited

U.S. PATENT DOCUMENTS

| | | | |
|---|---|---|---|
| 3,303,392 | 2/1967 | Zelina | 317/100 |
| 5,147,084 | 9/1992 | Behun et al. | 228/56.3 |
| 5,239,198 | 8/1993 | Lin et al. | 257/693 |

FOREIGN PATENT DOCUMENTS

| | | | |
|---|---|---|---|
| 5384681 | 7/1976 | Japan | 257/693 |
| 58-168141 | 11/1983 | Japan | 257/693 |
| 59-96751 | 6/1984 | Japan | . |
| 61-7657 | 1/1986 | Japan | 257/700 |
| 2-13796 | 1/1990 | Japan | 257/693 |
| 2-17659 | 1/1990 | Japan | 257/693 |
| 2-33482 | 3/1990 | Japan | 257/693 |
| 2-114941 | 9/1990 | Japan | 257/693 |

Primary Examiner—Jerome Jackson
Assistant Examiner—D. Monin
Attorney, Agent, or Firm—Keck, Mahin & Cate

[57] ABSTRACT

A package structure in which conductive layers are provided on the lower surface of a circuit substrate provided with a semiconductor element mounted on the upper surface thereof, which conductive layers are connected to a conductive seal portion via conductive through holes, whereby both satisfactory air-tightness and satisfactory electromagnetic shielding characteristics of the package structure can be obtained. Projections consisting of high-temperature solder are formed as externally connecting electrodes, whereby a surface packaging operation can be carried out smoothly.

6 Claims, 4 Drawing Sheets

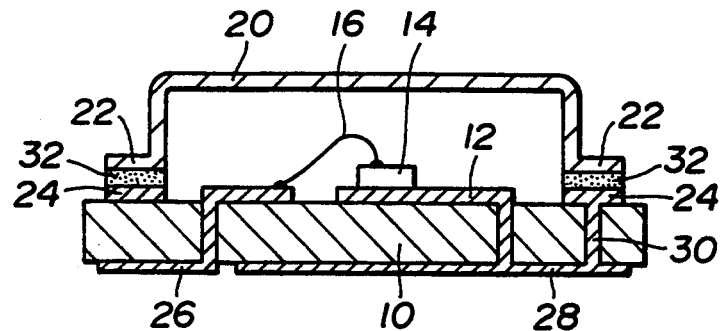
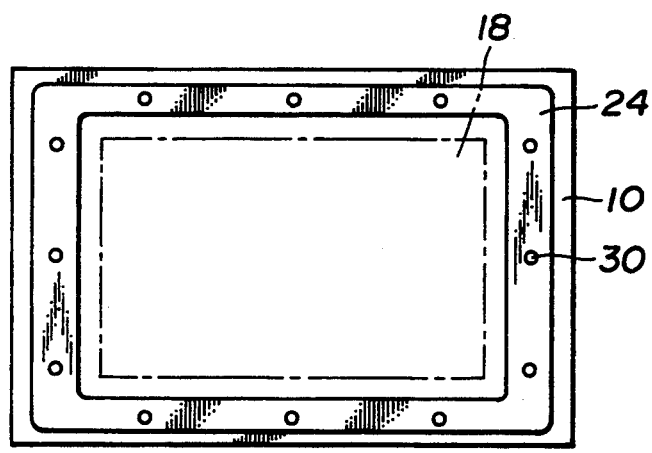
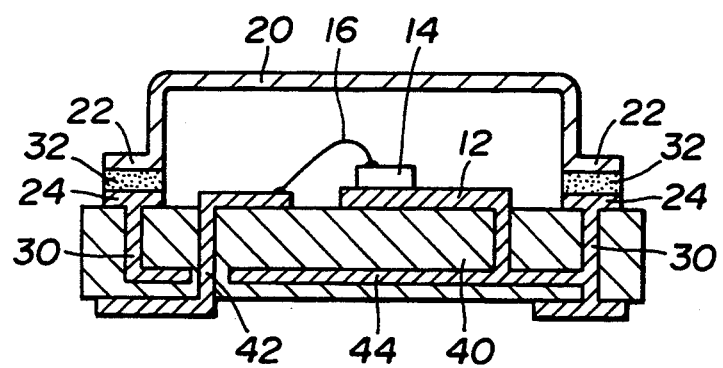

PACKAGE STRUCTURE FOR SEMICONDUCTOR DEVICES AND METHOD OF MANUFACTURING THE SAME

TECHNICAL FIELD

This invention relates to a package structure used to air-tightly seal a semiconductor device by covering the same with a conductive cap, and a method of manufacturing such package structures, and more particularly to a multi-electrode leadless package structure, such as a hybrid IC, and an externally connecting electrode structure for an electronic part in a leadless package structure.

According to the present invention, a conductive layer is provided on the lower side of a circuit substrate on the upper surface of which a semiconductor element is mounted, and it is connected to a conductive seal member via conductive through holes, whereby a seal structure having both air-tightness and electromagnetic shielding characteristics is provided, and the present invention also provides an externally connecting electrode structure used for an electronic part in a leadless package structure and capable of carrying out a surface packaging operation smoothly by utilizing projections consisting of high-temperature solder.

BACKGROUND ART

In a semiconductor device (for example, a hybrid IC) in which various types of semiconductors are mounted, air-tight sealing is carried out for the purpose of shutting off the semiconductors from the outside air. In a semiconductor device in which oscillating modules are mounted on the same circuit substrate, the provision of electromagnetic shielding characteristics are also required in addition to the air-tight sealing characteristics.

A metal case sealed by a resistance welding method (Japanese Utility Model Laid-open No. 33482/1990) is generally known as a package structure having both the air-tight sealing characteristics and electromagnetic shielding characteristics as mentioned above.

This metal case consists of a combination of an external lead-retaining stem and a cap. In this metal case, a semiconductor device formed by setting a semiconductor element on a circuit substrate and bonding the former to the latter with a gold wire is fixed to a stem, and a cap is put on the resultant product so as to seal the same.

A package structure produced by forming a second conductive layer on an intermediate layer provided on a circuit substrate, putting a flangeless cap on the resultant product, and soldering the end surface of the outer circumferential portion of the circuit substrate to electrically connect the second conductive layer and cap together and electro-magnetically shield the product has also been proposed recently (Japanese Utility Model Laid-open No. 13796/ 1990).

In the former package structure out of these prior art package structures, a metal case (stem and cap) in which the circuit substrate is housed is required, and this necessarily causes the manufacturing cost and the weight of the product to increase. Moreover, a dedicated sealing apparatus is indispensable for the production of this package structure. Therefore, it is very difficult for this package structure to meet a demand, which has been made in recent years, to reduce the weight, height, length and width thereof.

The latter package structure is formed by merely putting a cap on the circuit substrate, so that the dimensions and weight thereof can be reduced. However, since the cap is soldered to the end surface of the circuit substrate, it is necessary to separate the circuit substrate into parts and seal the parts separately, so that the operation efficiency becomes low. Therefore, this package structure is not suitable for the mass production of the devices of this kind.

In an electronic part having a plurality of semiconductor elements mounted on a single substrate, and a plurality of external electrodes, such as a hybrid IC, it is important to miniaturize a package and reduce the packaging area (improve the packaging density). Although various package structures have been developed, a leadless package structure is basically most advantageous in order to reduce the packaging area (refer, for example, to Japanese Patent Laid-open No. 84681/1978).

Various structures of an external electrode in a conventional leadless package have also been developed. These structures include, for example, a structure (Japanese Utility Model Laid-open No. 168141/1983) in which the circuit pattern provided on the packaging surface (bottom surface) of a ceramic substrate is used as it is as an external electrode, as well as a structure (Japanese Utility Model Laid-open No. 114941/1990) in which projections of regular solder are formed on a conductive pattern provided on the packaging surface of a ceramic substrate and used for forming an external electrode thereon. Such leadless parts are mounted on a packaging substrate (printed wiring board) and soldered to a circuit pattern by a reflow method or by a flow method, whereby the electrical and mechanical connection of the parts is carried out.

In these external electrode structures, the ceramic substrate and packaging substrate are liable to closely contact each other during a packaging operation, so that it is impossible to visually ascertain the electrical connection of a leadless part to a circuit pattern via solder. Even when the package structure is washed, flux remains thereon or solder balls (excess solder in the form of balls) are deposited thereon, and this would cause short-circuiting to occur. Moreover, since the ceramic substrate and packaging substrate have different thermal expansion coefficients and Young's moduli, flexure occurs easily in the connected portions of these substrates due to the stress occurring therein and attributable to the heat cycle, and due to the deformation thereof, such as a warp thereof.

A structure which is capable of partially solving these problems, and which uses hemispherical projections of conductive rubber as external electrodes, has also been proposed (Japanese Patent Laid-open No. 96751/1984). In this external electrode structure, the flexure of the ceramic substrate and packaging substrates can be prevented by the conductive rubber but solder cannot be used to connect a leadless part to the packaging substrate. Therefore, a leadless part is necessarily pressed against the packaging substrate by an auxiliary means or a thermocompression bonding method is necessarily employed. Moreover, it is necessary that the projections of conductive rubber be fixed one by one to predetermined portions of a ceramic substrate, so that the manday becomes high.

DISCLOSURE OF THE INVENTION

An object of the present invention is to provide a package structure for semiconductor devices, capable of eliminating the above-described drawbacks of prior art structures of this kind, having both excellent air-tightness and excellent electromagnetic shielding characteristics, capable of being formed to smaller dimensions and weight, and capable of being mass-produced at a low cost owing to the simple construction and a high sealing efficiency thereof.

Another object of the present invention is to provide an external electrode structure for leadless packages, capable of carrying out the electrical and mechanical connection of parts with a high reliability, capable of visually ascertaining the connection of parts, free from the problems of the occurrence of residue of flux and solder balls, and having a high productivity owing to the possibility of employing a single-step manufacturing method.

The present invention is basically directed to a package structure for semiconductor devices, which is used to cover a semiconductor device, in which a semiconductor element is mounted on the upper surface of a circuit substrate, with a conductive cap so as to airtightly seal the semiconductor device. In such a package structure, the cap is formed so as to have a flange at the circumferential portion thereof, and the circuit substrate has a first conductive layer on the portion of the upper surface thereof which corresponds to the flange of the cap, a second conductive layer covering the lower surface thereof, and a plurality of conductive through holes distributed at substantially regular intervals just under the first conductive layer and connecting the first and second conductive layers together. The joint portions of the flange and first conductive layer are sealed with a conductive sealing material.

The first conductive layer is usually formed so that it is in the shape of a frame extending along the outer circumference of a circuit substrate. In the case where a single-layer circuit substrate is used, a second conductive layer is formed on the substantially whole portion of the lower surface thereof except the portion of the same surface on which the lead electrodes of a semiconductor device are provided. The package structure according to the present intention is used specially suitably for, for example, a hybrid IC.

An air-tightly sealed structure is attained by sealing the flange of a cap and the first conductive layer on a circuit substrate with a conductive sealing material. Since a sealing operation is carried out on the upper surface of a circuit substrate, a plurality of package structures can be obtained at a time. The electromagnetic shielding of the package structure is done with a cap at the upper portion thereof, and with a conductive sealing material, a first conductive layer, conductive through holes and a second conductive layer at the side and lower portions thereof. The conductive through holes serving as the electromagnetic shielding members at the side portions of a package structure are positioned just under the first conductive layer. Accordingly, the area of the circuit substrate does not increase to a level higher than a required level, and this contributes to the saving of space.

The present invention is also directed to an external electrode structure for leadless packages, which has projections consisting of high-temperature solder of a melting point of 240°–330° C. and formed on an external electrode-forming conductive pattern provided on the packaging surface of a ceramic substrate used in a leadless package. It is recommended that the projections consisting of high-temperature solder be formed to a hemispheric shape or to a shape similar thereto, and to a height of around 0.2–1.0 mm. More preferably, each projection is formed to a frusto-hemispherical shape having a flat free end portion. When the projections are formed in this manner, an excellent self-aligning effect can be expected during a reflow soldering operation. The external electrode-forming conductive pattern is formed, for example, to a polygonal shape having not less than four apexes, a polygonal shape having an arcuate side, and a circular shape. The conductive pattern of such shapes may be produced by shaping a conductive material alone, or by shaping the openings in an organic or inorganic insulating layer formed on a conductive material. An external electrode-forming conductive pattern may be formed by providing a metallized layer of Mo—Mn (molybdenum—manganese) or W (tungsten) or a metallized layer of Cu (copper), Ag—Pd (silver—palladium) or Pt—Ag (platinum—silver), and then forming thereon projections consisting of high-temperature solder.

In order to produce such external electrodes, a non-separated-ceramic substrate from which a plurality of leadless parts are to be formed is prepared, and external electrode-forming conductive patterns are then formed on one surface of this substrate, projections which consist of high-temperature solder being formed at once on the conductive patterns by a reflow method or a flow method. The substrate is thereafter divided to obtain leadless parts. In order to connect a leadless part thus obtained to a packaging substrate, the former is mounted on the latter, and the projections consisting of high-temperature solder and the wiring pattern on the packaging substrate may be connected together by using regular solder, i.e., by melting regular solder alone by heating the same to a temperature not lower than the melting point of the regular solder and lower than the melting point of the high-temperature solder.

In the preferred embodiments of the present invention, the external electrodes consist of projections of high-temperature solder. Therefore, the projections are not melted in the leadless part-connecting step using regular solder, so that a clearance corresponding to the height of each projection occurs between the ceramic substrate and packaging substrate. This enables the ascertainment of the connection of the leadless part to be carried out visually after the packaging operation has been completed, and the problems of deposition of flux residue and solder balls which are liable to occur during a washing operation to be eliminated. The projections of solder and the clearance mentioned above serve to lessen the flexure of the connected portion of the part which is liable to occur due to the temperature cycle and a warp of the substrates.

Furthermore, the external electrode structure using solder enables a plurality of projections to be formed at once, and the electrical and mechanical connection of a leadless part by means of regular solder during a packaging operation to be effected reliably.

BRIEF DESCRIPTION OF THE DRAWINGS

FIG. 1 is a sectional view showing an embodiment of the package structure according to the present invention;

FIG. 2 is a plan view of a circuit substrate used in the package of FIG. 1;

FIG. 3 illustrates another embodiment of the package structure;

FIGS. 4A and 43 are a front elevation and a bottom view respectively of a first embodiment of the external electrode structure according to the present invention;

BEST MODE OF EMBODYING THE INVENTION

Figure 4A:
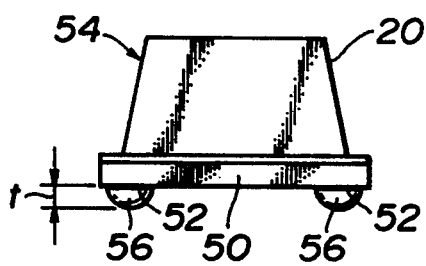

FIG. 1 is a sectional view showing an embodiment of the package structure for semiconductor devices according to the present invention, and FIG. 2 a plan view of a circuit substrate in this package structure. This embodiment uses a single-layer circuit substrate. A circuit substrate 10 consists of alumina or aluminum nitride. A circuit pattern 12 is provided on the upper surface of the circuit substrate 10, and a semiconductor element 14 of one of various types is mounted thereon, the circuit pattern 12 and semiconductor element 14 being then connected together with a gold wire 16 to form a semiconductor device. A region (designated by a reference numeral 18) shown by one-dot chain lines in FIG. 2 is a portion on which the semiconductor device is formed. A metal cap 20 is put on the resultant circuit substrate 10. In this embodiment, the cap 20 is formed so that it has a flange 22 projecting from a lower end portion of the outer circumference thereof in the horizontally outward direction, and this cap is plated wholly with nickel.

In this embodiment, a frame-shaped first conductive layer 24 is formed on the portion of the upper surface (semiconductor element-mounting surface) of the circuit substrate 10 which corresponds to the flange 22, and a second conductive layer 28 on the lower surface of the substrate 10 so as to cover the substantially whole thereof (except the portion thereof on which a lead electrode 26 is formed and the Portion thereof which is close to this electrode 26). A plurality of conductive through holes 30 are formed just under the first conductive layer 24 to connect the first and second conductive layers 24, 28 together. These conductive through holes 30 are provided so as to be distributed substantially uniformly in the circumferential portion of the circuit substrate 10. Twelve through holes 30 are formed at substantially regular intervals in this embodiment. These conductive layers can be formed easily by thick film printing, etching, selective plating, laminating, and through hole techniques.

In the practical operational procedure, various types of conductive layers are formed first on the circuit substrate 10 as mentioned above, and the semiconductor element 14 is then mounted thereon to produce a semiconductor device. A conductive sealing material 32, for example, a tin—lead solder preform is then placed on the first conductive layer 24, and the flange 22 of the cap 20 thereon via this sealing material 32. Thus, a package structure having both satisfactory air-tightness and satisfactory electromagnetic shielding characteristics can be obtained.

It is also possible to print the first conductive layer with zinc—lead solder paste as a conductive sealing material 32 and form a solder layer through a reflow furnace. When, for example, high-temperature solder having a high thermal resistance or conductive filler-containing sealing glass is used as a conductive sealing material with tin—lead semi-regular solder applied to the lower surface of the circuit substrate to form a lead electrode, a package structure compatible with SMD (surface-mounted part) as well is produced.

According to the present invention, a cap is combined with a circuit substrate at the upper surface of the latter. Therefore, the steps of forming in a series-arranged state at once on a single substrate a plurality of circuit substrate-forming parts having the above-mentioned conductive layers and conductive through holes, mounting semiconductor elements on the respective circuit substrate-forming parts to form semiconductor devices, fixing metal caps sequentially to the resultant semiconductor devices, and then cutting the substrate so that the semiconductor devices are separated from one another can be employed, and this enables semiconductor devices to be manufactured in large quantities at a low cost.

FIG. 3 is a sectional view of another embodiment of the present invention. This embodiment uses a multi-layer circuit substrate. Since the basic construction of this embodiment is identical with that of the previously-described embodiment, the corresponding parts are designated by the same reference numerals, and detailed descriptions of such parts are omitted. A circuit substrate 40 is provided with a circuit pattern 12 on the upper surface thereof, and a frame-shaped first conductive layer 24 is formed on the portion of the substrate which corresponds to a flange 22. In this embodiment, a second conductive layer 44 is formed so as to constitute the substantially whole of an intermediate layer (except the portions thereof which correspond to lead drawing conductive through holes 42 and the portions thereof which are close to these holes 42). A plurality of conductive through holes 30 are formed just under the first conductive layer 24 to connect the first conductive layer 24 and the second conductive layer 44, which constitutes an intermediate layer, together. These conductive through holes 30 are provided so as to be distributed substantially uniformly in the circumferential portion of the circuit substrate 40. A semiconductor element 14 is mounted on rush a circuit substrate 40, and connected thereto with a gold wire 16 to form a semiconductor device. The flange 22 of a cap 20 is then placed on the first conductive layer 24 via a conductive sealing material 32, whereby the cap is combined with the semiconductor device.

The present invention can also be applied to the case where a cap is put on a semiconductor device formed in part of a large circuit substrate to air-tightly seal and electromagnetically shield the semiconductor device.

According to the present invention, a cap having a flange at the circumferential portion thereof is used as mentioned above, and a first conductive layer is formed on the portion of the upper surface of a circuit substrate which corresponds to the flange, the flange and first conductive layer being sealed with a conductive sealing material. Therefore, the semiconductor device can be air-tightly sealed. The circuit substrate has a second conductive layer covering the lower surface thereof, and a plurality of uniformly distributed conductive through holes connecting these two conductive layers together, and uses a conductive cap and a conductive sealing material. Accordingly, the upper portion of the package structure is enclosed with the cap, and the side and lower portions thereof with the conductive sealing material, first conductive layer, conductive through holes and second conductive layer, whereby the package structure is electromagnetically shielded.

Since the conductive through holes connecting the first and second conductive layers together in the present invention are positioned just under the first conductive layer, the size of the circuit substrate can be reduced to the lowest possible level required for the air-tight sealing of a package structure, so that the space can be saved. Since a metal stem having large weight is unnecessary, the weight of a package structure can be reduced. Moreover, a package structure compatible with SMD easily is permitted by the construction of the circuit substrate.

According to the present invention, a cap is sealed to the upper surface of a circuit substrate. Therefore, the steps of forming a plurality of circuit substrate-forming parts in a series-arranged state at once on a single substrate, forming semiconductor devices on these substrate-forming parts, placing caps sequentially on these semiconductor devices and sealing the same, and finally cutting off the packaged structures from one another can be employed. Accordingly, the present invention is suitable for the mass production of package structures and enables the cost of manufacturing the same to be reduced.

The embodiments of the external electrode structure for leadless packages according to the present invention will now be described.

Figure 4B:
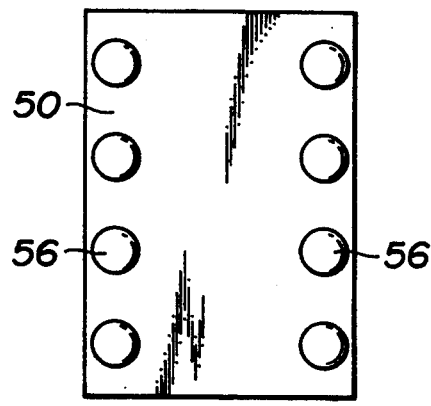

Referring to FIGS. 4A and 4B, which show an embodiment of the external electrode structure for leadless packages according to the present invention, a plurality of semiconductor elements (not shown) are mounted on a ceramic substrate 50, and a cap 20 is pat on the resultant substrate and seal the same to form a leadless part 54. External electrode-forming conductive patterns 52 are provided along two opposite sides of a packaging surface (lower surface) of the ceramic substrate 50, and hemispherical projections 56 consisting of high-temperature solder having a melting point of 240°–330° C. are formed on these conductive patterns 52, these projections being used as external electrodes (electrodes for connecting the leadless part 54 to a packaging substrate).

In the embodiment of FIGS. 4A and 4B, the circular conductive patterns 52 on which the projections 56 are provided are defined by a conductive material alone. Forming the conductive patterns circularly is desirable because such conductive patterns enable the projections to be swollen hemispherically, the bonding strength thereof to increase and the height thereof to increase. The projections 56 are formed so that the height t thereof becomes around 0.2–1.0 mm. When a clearance substantially corresponding to this height remains between the ceramic substrate and packaging substrate, the portions of a part connected with solder can be visually ascertained and the removing of flux and solder balls can be done easily. The high-temperature solder used in the present invention include In—Pb solder containing not more than 30% by weight of In (indium), Pb solder containing not less than 85% by weight of Pb (lead), and Pb-Sb or Sn-Sb solder containing not more than 15% by weight of Sb (antimony). The conductive pattern may be formed to a polygonal shape having not less than four apexes and a polygonal shape having some arcuate sides in addition to a circular shape referred to above.

Figure 5A:
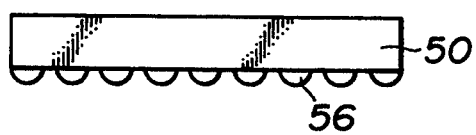
FIGS. 5A and 5B are a front elevation and a bottom view respectively of another embodiment of the external electrode structure.
Figure 5B:
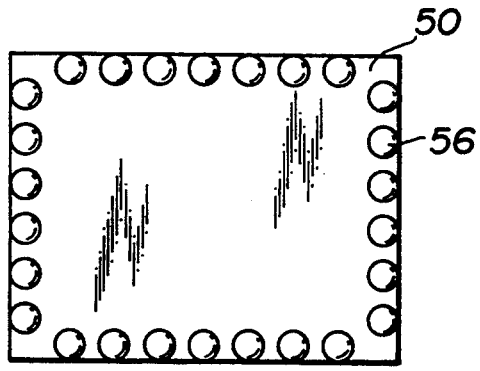

The configuration of the external electrodes may be arbitrarily determined. When a certain number of external electrodes are to be provided, the projections 56 consisting of high-temperature solder may be formed along four sides or circumferential portions of the packaging surface of a ceramic substrate 50 as shown in FIGS. 5A and 5B. The projections may also be formed in a latticed arrangement, an illustration of which is omitted, on the packaging surface of the ceramic substrate.

Figure 6A:
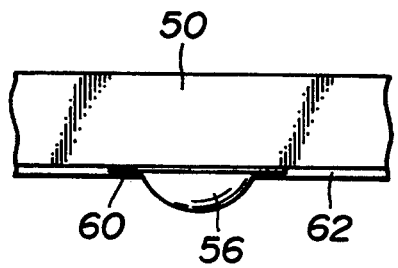
FIGS. 6A and 6B are a front elevation and a partially cut-away bottom view respectively of still another embodiment of the external electrode structure.
Figure 6B:
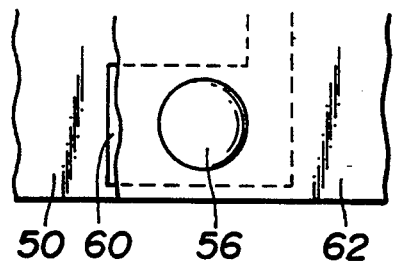
Figure 7:
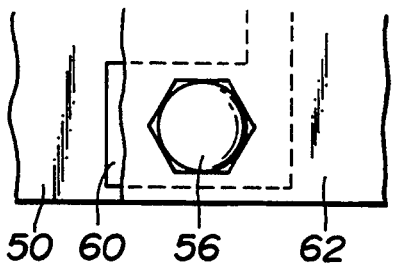
FIG. 7 is a partially cutaway bottom view of a further embodiment of the external electrode structure.

FIGS. 6A, 6B and 7 show examples of the shapes, which are defined by those of the openings in the insulating layers 62 formed on a conductive material 60, of the conductive patterns on which the projections 56 of high-temperature solder are formed. In the example of FIGS. 6A and 6B, the opening is formed circularly, and, in the example of FIG. 7, the opening is formed hexagonally. The insulating layer 62 may be formed by using an organic material, or an inorganic material, such as glass.

Figure 8:
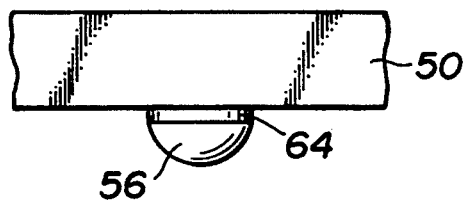
FIG. 8 illustrates another embodiment of the external electrode structure.

There is also an external electrode structure in which projections 56 consisting of high-temperature solder are formed on metallized layers 64 of Mo—Mn or W provided as a conductive layer used for the formation of external electrodes, as shown in FIG. 8. These metallized layers 64 are formed by applying paste of the above-mentioned material to a circuit substrate by a screen printing method, and baking the paste at a high temperature of one thousand several hundred degrees centigrade. Providing such metallized layers 64 is preferable because these materials, which are also used for leads, have a very high bonding strength with respect to solder, and enable the height of the projections to be increased by the thickness of the metallized layers 64. In order to reduce the manufacturing cost, metallized layers of Cu, Ag—Pd and Pt—Ag may be formed besides those of the above-mentioned materials. In order to form metallized layers of Cu, Ag—Pd or Pt—Ag, the baking temperature should be set to 850°–900° C.

Figure 9:
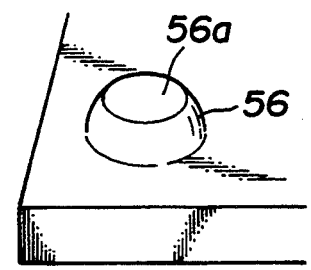
FIG. 9 is a perspective view showing the shape of still another embodiment of the external electrode structure.

The projections constituting the external electrodes may be domed at the free end portions thereof, i.e., formed hemispherically as shown in FIGS. 4A and 5A, and more preferably, they are formed frusto-hemispherically so that the projecting end portions thereof have flat surfaces as shown in FIG. 9. The reason resides in the discovery by the inventor of the present invention that, when the projections are formed hemispherically, they point-contact the packaging substrate, so that a satisfactory self-aligning effect of the projections during a solder reflow operation is not obtained, whereby a reliably high electronic part-packaging accuracy may not be obtained. On the other hand, when flat surfaces 56a are formed as shown in FIG. 9, an electronic part moves to a proper position after a solder reflow operation has been completed even if the electronic part deviates from a proper position when it is mounted on a solder pad. Namely, when a solder reflow operation is carried out with the electronic part left deviating from the packaging position, the electrodes of FIG. 9 are drawn to the center of the pad owing to the surface tension of the solder being melted, whereby the electronic part is mounted on the proper position.

Figure 12:
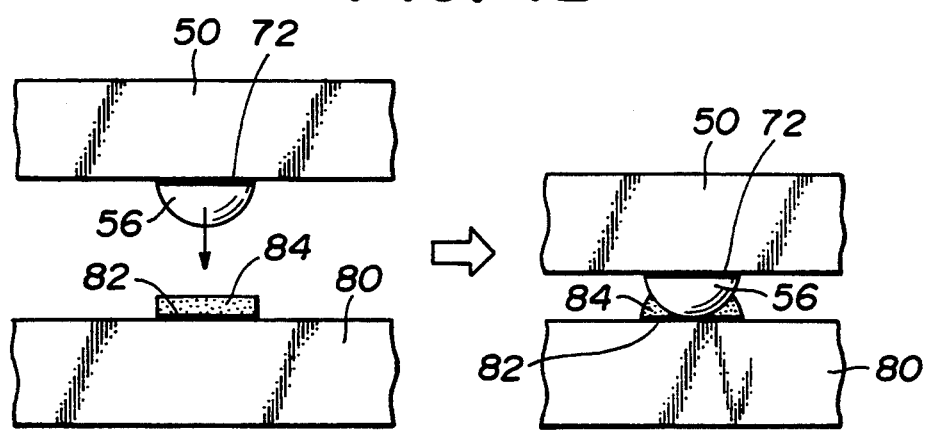
FIG. 12 illustrates a method according to the present invention of fixing a leadless part to a packaging substrate.

Table 1 shows the results of measurement of the amounts of deviation, which occurs after a solder reflow operation has been completed, of ten examples of electronic parts with the level of deviation of these parts prior to the solder reflow operation set to 0.4 mm. The results in Table 1 show that, when projections formed to a flat surface-carrying hemispherical shape as shown in FIG. 9 are employed, the deviation occurring after a solder reflow operation has been completed of all the examples decreases to within 0.3 mm to enable the electronic parts to be mounted with a very high accuracy. Out of the examples which employ projections formed to an ordinary hemispherical shape as shown in FIG. 12, four examples deviate 0.5 mm after the completion of a solder reflow operation.

Table 2 shows the results of measurement similar to that the results of which are shown in Table 1, and conducted with level of deviation of examples prior to a solder reflow operation set to 0.7 mn. All the examples in this Table 2 that employ flat surface-carrying projections have a decreased level of deviation of within 0.3 mm and can display a satisfactory self-aligning effect, while more than a half of the examples which employ hemispherical projections having no flat surfaces have a slightly increased level of deviation of the position in which a part is mounted.

As is clear from the above, it is desirable that the projections constituting external electrodes be formed so that each thereof has a flat surface-carrying hemispherical body shown in FIG. 9.

TABLE 1

(Relation, which is determined when the deviation of the part-mounted position prior to the solder reflow operation is set to 0.4 mm, between the shape of projections and a deviation of the part-mounted position occurring after the completion of the solder reflow operation)

| Deviation of part-mounted position after the completion of a solder reflow operation (mm) | Shape of projections | |
|---|---|---|
| | Frusto-hemispherical | Hemispherical |
| Not more than 0.05 | One example | |
| 0.1 | Two examples | |
| 0.2 | Two examples | |
| 0.3 | Five examples | One example |
| 0.4 | | Five examples |
| 0.5 | | Four examples |

TABLE 2

(Relation, which is determined when the deviation of the part-mounted position prior to the solder reflow operation is set to 0.7 mm, between the shape of projections and a deviation of the part-mounted position occurring after the completion of the solder reflow operation)

| Deviation of part-mounted position after the completion of a solder reflow operation (mm) | Shape of projections | |
|---|---|---|
| | Frusto-hemispherical | Hemispherical |
| 0.1 | One example | |
| 0.2 | Six examples | |
| 0.3 | Three examples | |
| 0.4 | | |

TABLE 2-continued

| 0.7 | Three examples |
| 0.8 | Seven examples |

Figure 10:
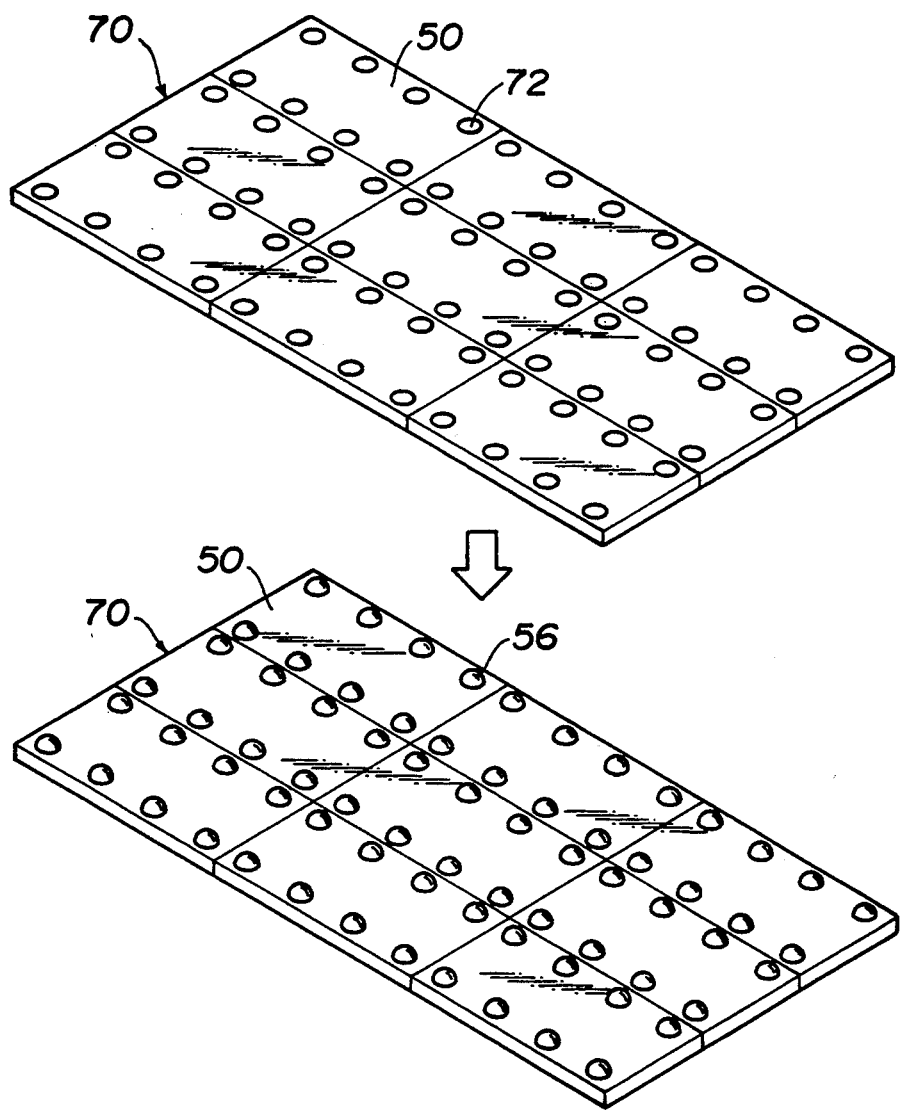
FIGS. 10 and 11 illustrate the methods of forming external electrode structures.

A method of forming a plurality of projections mentioned above will now be described. The formation of spherical projections shown in, for example, FIG. 4A will be described for the convenience of explanation. The projections 56 can be formed collectively at once by the methods shown in FIGS. 10 and 11. In both of these methods, conductive patterns 72 on which external electrodes are to be formed are formed on one surface of an undivided multi-substrate producing plate 70 (9 substrate part-producing plate in this example) of a ceramic substrate 50, and projections 56 consisting of high-temperature solder are formed at once on these conductive patterns 72. The example of FIG. 10 uses a reflow method, which consists of the steps of applying solder paste to the upper surfaces of the conductive patterns 72 on the ceramic substrate 50 by screen printing or by means of a dispenser, and passing the resultant product through a reflow apparatus so as to melt the high-temperature solder and swell the same to a hemispherical shape by utilizing the surface tension thereof. Since high-temperature solder is used, it is preferable to use a reflow apparatus capable of maintaining a nitrogen atmosphere.

Figure 11:
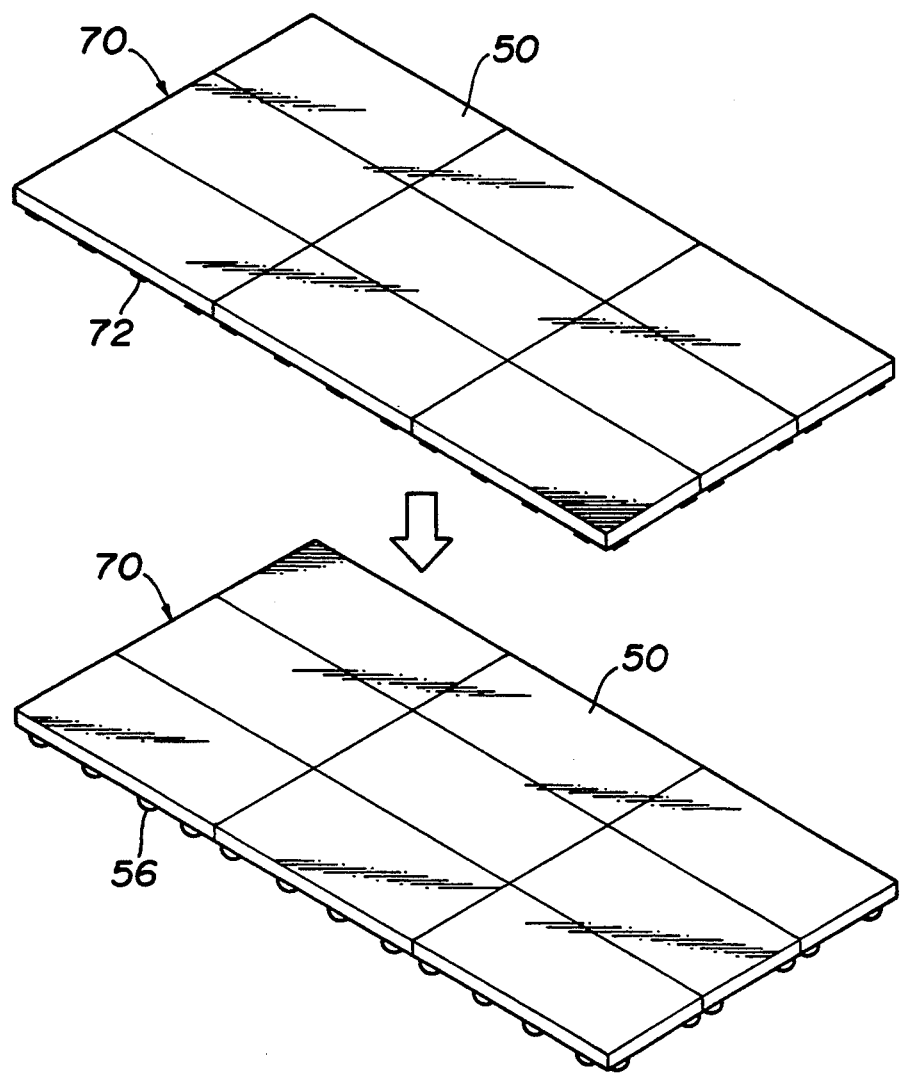

FIG. 11 shows an example using a flow method, in which a ceramic substrate 50 having conductive patterns 72 thereon is passed through a flow apparatus so as to deposit high-temperature molten solder on these patterns and swell the same to a hemispherical shape in the same manner. Anyway, a plurality of projections 56 of high-temperature solder which are to form external electrodes can be formed collectively at once on the multi-substrate producing plate 70, so that the productive efficiency is very high.

The connection of a leadless part having such projections 56 of high-temperature solder as external electrodes is carried out by the steps shown in FIG. 12. The packaging surface of a ceramic substrate 50 constituting a leadless part is directed to a packaging substrate 80, and the external electrodes (projections 56 consisting of high-temperature solder) and wiring patterns 82 on the packaging substrate 80 are opposed to and aligned with each other, regular solder (60 Sn/40 Pb solder having a melting point of 183°–188° C.) being then heated to a temperature not lower than the melting point of the regular solder and lower than that of the high-temperature solder, whereby the leadless part is connected. In the example of FIG. 12, solder paste (regular solder) 84 is applied to the packaging substrate 80, and the leadless part is connected by a reflow method. The connection of the part may also be carried out by a flow method. In any case, the regular solder 84 alone is melted, and the projections 56 consisting of high-temperature solder is left substantially as they are with the electrical and mechanical connection between the projections 56 and the wiring patterns 82 on the packaging substrate 80 effected.

In the external electrode structure for leadless packages according to the present invention, the external electrodes are not melted while the leadless part is connected by using regular solder, so that a clearance corresponding to the height of the projections can be created between the ceramic substrate and packaging substrate. This enables the visual ascertainment of the solder-connection of the leadless part to be carried out after the mounting of the part has been completed, and the washing of the electrode structure to be done without causing flux residue to occur and without causing the deposition of solder, which gives rise to short-circuiting, to occur. Even when stress is imparted to the connected portions of the part due to a difference between the thermal expansion coefficient of the ceramic substrate and that of the packaging substrate and the flexure of the latter substrate, warping is lessened owing to the clearance between high-temperature solder projections and these substrates.

Moreover, since the external electrode structure is form out of high-temperature solder, the projections constituting the external electrodes can be formed collectively at once. Therefore, the production of this electrode structure can be carried out easily with a high accuracy, and the productivity becomes high. Since regular solder can be used during the mounting of a leadless part, the electrical and mechanical connection of the projections with the wiring patterns can be carried out easily and reliably, and a highly reliable external electrode can be obtained.

We claim:

1. A package structure for a semiconductor device having a lead electrode comprising:
   an electrically conductive cap having a flange at a circumference thereof,
   a circuit substrate having a ceramic substrate member, a first surface covered with said conductive cap and sealed air-tightly, a second surface having electrically conductive patterns for providing thereon external electrodes, and projections of high-temperature solder having a melting point of approximately 240°–330° C. are formed on said conductive patterns,
   wherein said circuit substrate comprises:
   a first electrically conductive layer on said first surface of said circuit substrate extending along an outer circumference of said circuit substrate,
   a second electrically conductive layer covering said second surface of said circuit substrate, said second conductive layer being formed substantially entirely over said second surface of said circuit substrate except having a portion for said lead electrode of said semiconductor device,
   a plurality of electrically conductive through-holes, disposed uniformly in said circuit substrate directly below said first conductive layer and said flange, for connecting said first conductive layer with said second conductive layer, and
   electrically conductive sealing means for sealing contact surfaces of said flange of the conductive cap to said first conductive layer.

2. A package structure according to claim 1, wherein the projections of high temperature solder have heights in a range of 0.2–1.0 mm.

3. A package structure according to claim 1, wherein said conductive patterns for providing thereon said external electrodes have a circular shape.

4. A package structure according to claim 1, wherein said conductive patterns for providing thereon said external electrodes are defined by an electrically conductive material.

5. A package structure according to claim 1, wherein each of said projections of high-temperature solder is formed frusto-hemispherically to provide a flat surface at free end portion thereof.

6. A package structure according to claim 1, wherein a metallized layer is formed to provide an electrically conductive pattern, and said projections of the high-temperature solder are formed on said metallized layer.

* * * * *